(12) United States Patent
Tungare et al.

(10) Patent No.: US 10,829,866 B2
(45) Date of Patent: Nov. 10, 2020

(54) WAFER CARRIER AND METHOD (71) Applicant: Infineon Technologies Americas Corp., El Segundo, CA (US)

(72) Inventors: Mihir Tungare, Roseville, MN (US);
Peter Kim, Stillwater, MN (US);
Jianwei Wan, Woodbury, MN (US);
Chankyung Choi, Woodbury, MN (US)

(73) Assignee: Infineon Technologies Americas Corp., El Segundo, CA (US)

( * ) Notice: Subject to any disclaimer, the term of this patent is extended or adjusted under 35 U.S.C. 154(b) by 22 days.

(21) Appl. No.: 15/477,313

(22) Filed: Apr. 3, 2017

(65) Prior Publication Data

US 2018/0282899 A1 Oct. 4, 2018

(51) Int. Cl.
| | |
|---|---|
| *C30B 25/12* | (2006.01) |
| *C30B 25/18* | (2006.01) |
| *C30B 29/40* | (2006.01) |
| *C30B 29/06* | (2006.01) |
| *C23C 16/30* | (2006.01) |
| *C23C 16/458* | (2006.01) |
| *H01L 21/02* | (2006.01) |
| *H01L 21/683* | (2006.01) |
| *H01L 21/687* | (2006.01) |
| *H01L 23/544* | (2006.01) |

(52) U.S. Cl.
CPC ........... *C30B 25/12* (2013.01); *C23C 16/303* (2013.01); *C23C 16/4584* (2013.01); *C30B 25/18* (2013.01); *C30B 29/06* (2013.01); *C30B 29/403* (2013.01); *H01L 21/0242* (2013.01); *H01L 21/0254* (2013.01); *H01L 21/02378* (2013.01); *H01L 21/02381* (2013.01); *H01L 21/6835* (2013.01); *H01L 21/68721* (2013.01); *H01L 21/68728* (2013.01); *H01L 23/544* (2013.01); *H01L 2221/68309* (2013.01); *H01L 2223/54493* (2013.01)

(58) Field of Classification Search
CPC .............................. C30B 25/12; H01L 21/683
See application file for complete search history.

(56) References Cited

U.S. PATENT DOCUMENTS

| | | |
|---|---|---|
| 5,840,124 A | 11/1998 | Gurary et al. |
| 6,001,183 A | 12/1999 | Gurary et al. |
| (Continued) | | |

FOREIGN PATENT DOCUMENTS

| | | | |
|---|---|---|---|
| EP | 1657744 A2 | 5/2006 | |
| JP | 2005232488 A | 9/2005 | |
| WO | WO-2014196323 A1 * | 12/2014 | ............ C30B 25/12 |

OTHER PUBLICATIONS

Dadgar, A. et al., "Improving GaN-on-silicon properties for GaN device epitaxy", Physica Status Solidi C 8, No. 5, 2011, pp. 1503-1508.
Jang, Seong-Hwan et al., "High-quality GaN/Si(1 1 1) epitaxial layers grown with various Al0.3Ga0.7N/GaN superlattices as intermediate layer by MOCVD", Journal of Crystal Growth, vol. 253, 2003, pp. 64-70.

(Continued)

*Primary Examiner* — Hua Qi
(74) *Attorney, Agent, or Firm* — Murphy, Bilak & Homiller, PLLC (57) ABSTRACT

In an embodiment, a wafer carrier includes a pocket sized and shaped to accommodate a wafer, the pocket being defined by a base and a substantially circular perimeter including an inner face and an outer face. The substantially circular perimeter includes a notch in the inner face.

7 Claims, 9 Drawing Sheets

(56) References Cited

U.S. PATENT DOCUMENTS

| | | | |
|---|---|---|---|
| 6,187,134 B1 | 2/2001 | Chow et al. | |
| 6,318,957 B1 | 11/2001 | Carr et al. | |
| 6,617,060 B2 | 9/2003 | Weeks, Jr. et al. | |
| 6,682,295 B2 | 1/2004 | Blank et al. | |
| 6,878,395 B2 | 4/2005 | Kaeppeler | |
| 6,983,620 B2 | 1/2006 | Kaeppeler | |
| 7,291,542 B2 | 11/2007 | Iwamatsu et al. | |
| 7,435,608 B2 | 10/2008 | Shibata | |
| 8,575,660 B2 | 11/2013 | Nelson et al. | |
| 2002/0066412 A1 | 6/2002 | Yao et al. | |
| 2002/0197144 A1 | 12/2002 | Blank et al. | |
| 2009/0110805 A1 | 4/2009 | Kaeppeler et al. | |
| 2010/0055318 A1 | 3/2010 | Volf et al. | |
| 2010/0171823 A1 | 7/2010 | Yamamoto et al. | |
| 2010/0225011 A1 | 9/2010 | Wang et al. | |
| 2011/0049779 A1 | 3/2011 | Egami et al. | |
| 2011/0215071 A1 | 9/2011 | Mitrovic et al. | |
| 2012/0270407 A1* | 10/2012 | Werner | H01L 21/68735 438/758 |
| 2014/0261187 A1 | 9/2014 | Krishnan et al. | |
| 2015/0332928 A1 | 11/2015 | Priewasser | |
| 2016/0115623 A1* | 4/2016 | Ito | C30B 25/12 118/725 |

OTHER PUBLICATIONS

Kim, Min-Ho et al., "Effects of step-graded $Al_xGa_{1-x}N$ interlayer on properties of GaN grown on Si(111) using ultrahigh vacuum chemical vapor deposition", Applied Physics Letters, vol. 79, No. 17, Oct. 2001, pp. 2713-2715.

Maruska, H.P. et al., "The Preparation and Properties of Vapor-Deposited Single-Crystalline GaN", Applied Physics Letters, vol. 15, No. 10, Nov. 1969, pp. 327-329.

Okada, Yasumasa et al., "Precise determination of lattice parameter and thermal expansion coefficient of silicon between 300 and 1500 K", Journal of Applied Physics, vol. 56, No. 2, Aug. 1984, pp. 314-320.

Raghavan, Srinivasan et al., "Growth stresses and cracking in GaN films on (111) Si grown by metalorganic chemical vapor deposition. II. Graded AlGaN buffer layers", Journal of Applied Physics, vol. 98, 2005, pp. 023515 1-8.

Tungare, Mihir et al., "Crack-free III-nitride structures (>3.5 μm) on silicon", Materials Research Society Symposia Proceedings vol. 1324, 2011, pp. 9-15.

Marchand, H. et al., "Metalorganic chemical vapor deposition of GaN on Si (111): Stress control and application to field-effect transistors", Journal of Applied Physics, vol. 89, No. 12, Jun. 2001, pp. 7846-7851.

* cited by examiner

WAFER CARRIER AND METHOD

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). Group III-nitride-based semiconductor devices, such as gallium nitride-based devices, are now emerging as attractive candidates to carry large currents, support high voltages and to provide very low on-resistance and fast switching times.

In the manufacture of some semiconductor devices, such as Group III-nitride-based semiconductor devices, one or more semiconductor layers may be epitaxially deposited onto a substrate having a different composition. The substrate is suitably selected to allow epitaxial growth of the semiconductor material on the surface of that substrate using a suitable technique. For example, one or more Group III nitride-based epitaxial layers may be grown on a <111> single crystal silicon wafer using MOCVD (Metal Organic Chemical Vapour Deposition) to produce a structure suitable for a Group III nitride-based semiconductor device. Such growth techniques typically require heating the wafer to temperatures of 600° C. or above and exposing the heated surface to reactants while rotating the wafer. The wafer may be held by use of a wafer carrier during growth of the epitaxial layer or layers.

Further improvements to increase the quality of the deposited epitaxial layers and the performance of devices fabricated using the epitaxial layers are desirable.

SUMMARY

In an embodiment, a wafer carrier includes a pocket sized and shaped to accommodate a wafer, the pocket being defined by a base and a substantially circular perimeter including an inner face and an outer face. The substantially circular perimeter includes a notch in the inner face.

In an embodiment, a wafer carrier includes a pocket sized and shaped to accommodate a wafer, the pocket including a base and a substantially circular perimeter, and a removable orientation marker. The removable orientation marker includes an outer surface and an inner surface, the outer surface having an arcuate form sized and shaped to mate with the substantially circular perimeter of the pocket, and the inner surface comprising a flat face. The removable orientation marker further includes a notch at a first end of the flat face.

In an embodiment, a method includes placing a wafer in a wafer carrier having a pocket sized and shaped to accommodate a wafer, the pocket being defined by a base and a substantially circular peripheral wall including an inner face and an outer face, wherein a notch in the inner face of the substantially circular peripheral wall provides a localised increased gap between the inner face and a side face of the wafer, the wafer carrier having a predetermined direction of rotation about an axis positioned perpendicular to an upper surface of the base of the pocket, rotating the wafer carrier in the predetermined direction of rotation, and epitaxially depositing a semiconductor layer on the wafer while rotating the wafer carrier in the predetermined direction of rotation.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1b illustrates a cross-sectional view of the wafer carrier of FIG. 1a.

FIG. 2b illustrates an enlarged view of a portion of the wafer carrier of FIG. 2a.

FIG. 3b illustrates the cross-sectional view along the line A-A shown in FIG. 3a.

FIG. 3d illustrates a cross-sectional view along the line D-D shown in FIG. 3a.

FIG. 4b illustrates detailed view F of FIG. 4a.

FIG. 4c illustrates a bottom view of the orientation marker of FIG. 4a.

FIG. 4d illustrates cross-sectional view of the orientation marker of FIG. 4a.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention.

The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where 0<x<1.

In some embodiments, a wafer carrier is provided with a pocket that conforms to the shape of the substrate or wafer used for epitaxial growth of highly mismatched layers using techniques like MOCVD and includes a notch between the side face of the wafer and the inner side face of the pocket. During growth, the wafers are subjected to thermal cycling, curvature changes, and also some movement within the wafer carrier pocket. The use of one or more relief notch(es) avoids that the wafers become stuck or wedged in the wafer carrier. Yield and productivity can be improved by preventing breakage of wafers during epitaxial growth.

Furthermore, suppressed crack and slip line formation is achieved due to the wafer carrier conforming to the shape of the wafers, since the temperature uniformity of the wafer during deposition of material onto the wafer is improved. Additionally, the deposition of material into the interior of the pocket is avoided, since the shape of the pocket of the wafer carrier conforms better to the shape of the wafer. This also assists in increasing the temperature uniformity of the wafer during deposition, avoids local stress points between the pocket and the wafer due to the build up of deposit on the pocket and improves the quality of the epitaxy of the films or layers grown on the wafer.

The wafer carrier according to any one of the embodiments may be used for the high temperature high quality epitaxial growth of semiconductor structures such as GaN-based HEMT (High Electron Mobility Transistor) structures. These multi-layer structures may include multiple Group III nitride-based layers of differing composition and the structure may have a thickness of at least 3 μm. These multi-layer epitaxial structures may be grown on large area Si substrates, for example a 6 inch diameter single crystal silicon wafer.

Figure 1A:
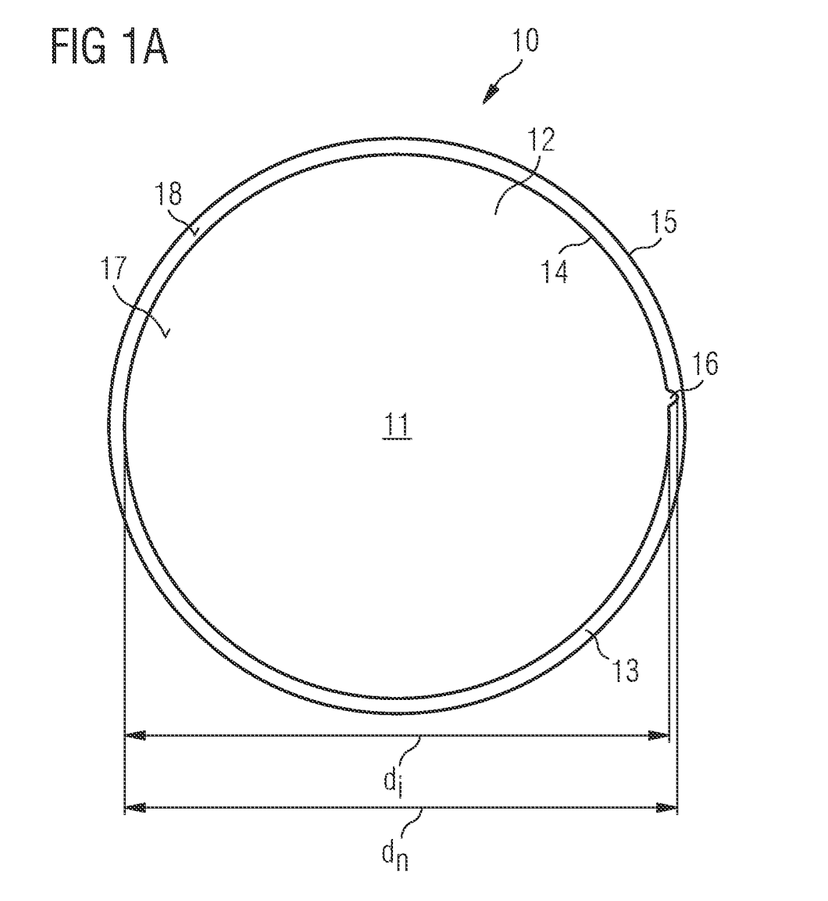
FIG. 1a illustrates a top view of a wafer carrier according to an embodiment.
Figure 1B:
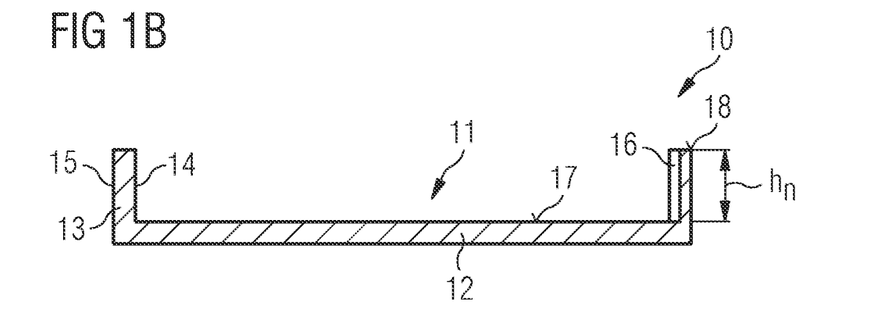

FIG. 1a illustrates a top view and FIG. 1b a cross-sectional view of a wafer carrier 10 according to an embodiment. The wafer carrier 10 includes a pocket 11 which is sized and shaped to accommodate a wafer, for example a single crystal wafer such as a single crystal silicon wafer or a single crystal sapphire wafer. The pocket 11 is defined by a base 12 and a perimeter 13 which includes an inner face 14 and outer face 15. The perimeter 13 further includes a notch 16 in the inner face 14. In this embodiment, the perimeter 13 is substantially circular. In other embodiments, the inner face 14 of the perimeter 13 may have a contour which is adapted to conform to a wafer which is to be accommodated within the pocket 11. For example, the inner face 14 may also include a portion having a flat face rather than a circular or arcuate face.

In the embodiment illustrated in FIG. 1a, the inner face 14 and the outer face 15 are substantially circular and define a wall of the circular perimeter 13 that uninterruptedly bounds the base 12 of the pocket 11. The notch 16 provides the pocket 11 with a localised region of increased diameter $d_n$ compared to the inner diameter $d_i$ of the substantially circular perimeter 13 at a position of the inner face 14 adjacent the notch 16. The notch 16 provides the substantially circular perimeter 13 with a localised region having a correspondingly reduced wall thickness. The notch 16 may have a height $h_n$ which extends from an upper surface 17 of the base 12 of the pocket 11 to an upper surface 18 of the substantially circular perimeter 13.

In use, a wafer is placed into the pocket 11 such that the lower surface of the wafer rests on the upper surface 17 of the base 12 and such that edge faces of the wafer are substantially concentric with the inner face 14, in the case of a wafer in the form of a circular disc. In some embodiments, the diameter of the wafer and the inner diameter $d_i$ of the substantially circular perimeter 13 are selected such that the gap between them is less than 0.5 mm.

One or more layers may be deposited on an upper surface of the wafer while the wafer is positioned in the wafer carrier 10. For example, one or more semiconductor layers may be epitaxially deposited or epitaxially grown on the upper surface of the wafer using a vacuum deposition technique. The composition of the epitaxially deposited layers may differ from the composition of the semiconductor wafer. For example, one or more Group III nitride-based layers may be epitaxially deposited on a single crystal silicon wafer using MOCVD.

An epitaxial layer or epitaxially deposited or grown layer has an epitaxial relationship to the underlying substrate and/or layer, or in other words an epitaxial layer or epitaxially deposited or grown layer has a single well-defined orientation with respect to the underlying substrate and/or layer, and may be monocrystalline.

The notch 16 in the inner face 14 of the substantially circular perimeter 13 may be used to provide stress relief and compensate for a difference in the thermal expansion coefficient of the material of the wafer and the material of the wafer carrier 10 and may be used to assist in the removal of the wafer from the pocket 11.

The wafer carrier 10 may include a material which is non-reactive with the material of the wafer and/or epitaxial layer under the growth conditions used. In some embodiments, the wafer carrier may be formed from graphite or graphite coated silicon carbide.

The wafer carrier 10 may include a pocket 11 having an inner shape that is adapted to the outer shape of a wafer that is to be processed in the wafer carrier 10. For example, the inner face 14 of the perimeter 13 of the pocket 11 may have a contour that is adapted to conform to the outer contour of the wafer which is to be accommodated within the pocket 11. In the embodiment illustrated in FIG. 1a, the wafer may be substantially circular and have a diameter which is slightly smaller than the inner diameter of the substantially circular perimeter 13.

Wafers, and in particular single crystal wafers used for the fabrication of semiconductor devices, typically include an orientation marker. For example, the orientation marker may have the form of a flat face which may be formed by removing an edge region of a circular wafer or may have the form of a notch formed by removing a portion of the wafer.

The wafer carrier may include an orientation marker which is arranged, sized and shaped to engage with the orientation marker of the wafer. Consequently, the wafer may substantially cover the interior of the pocket when positioned in the pocket, since the orientation marker of the wafer carrier is arranged, sized and shaped to engage with the orientation marker of the wafer. For example, for a wafer having an orientation marker in the form of a flat face formed at an edge of the wafer, the wafer carrier may include an inner contour having a flat face which is arranged, sized and shaped to correspond with the flat face of the outer contour of the wafer.

Figure 2A:
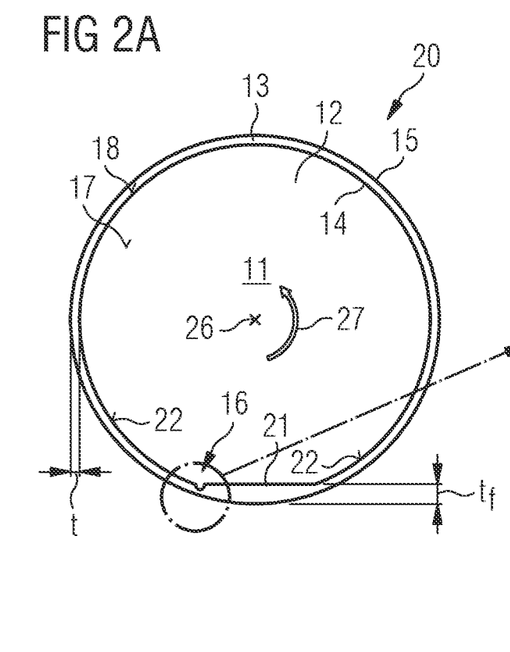
FIG. 2a illustrates a top view of a wafer carrier including an orientation marker according to an embodiment.
Figure 2B:
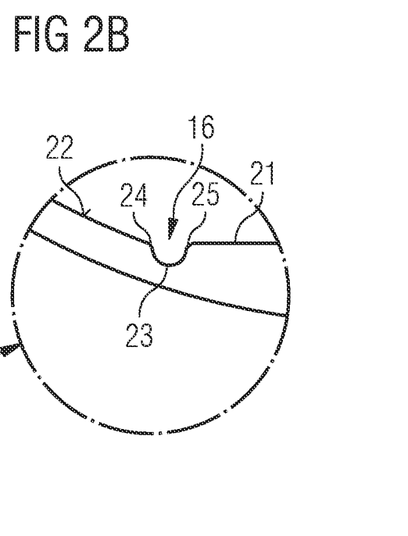

FIG. 2a illustrates a top view and FIG. 2b a detailed view of a wafer carrier 20 including a pocket 11 defined by a base 12 and a substantially circular perimeter 13. The wafer carrier 20 further includes an orientation marker in the form of a flat face 21.

The flat face 21 forms a chord with the inner face 14 of the substantially circular perimeter 13. In other words, the flat face 21 is a line segment that connects two points on the inner face 14 of the substantially circular perimeter 13. The chord has a length which is less than the inner diameter $d_i$ of the circular perimeter 13. The flat face 21 provides a linear or straight face which extends into the remainder of the inner face 14 of the substantially circular perimeter 13. The remainder of the inner face 14 has a substantially circular shape and, therefore, provides an arcuate inner face 22 for the pocket 11. The inner face 14, outer face 15 and flat face 21 are arranged substantially perpendicularly to the base 12 of the pocket 11. The flat face 21 is positioned such that the substantially circular perimeter 13 has a wall thickness $t_f$ between the flat face 21 and the outer face 15 that is greater than the wall thickness t between the arcuate surface 22 of the inner surface 14 and the outer face 15.

The substantially circular perimeter 13 also includes a notch 16 which is positioned at an interface between the flat face 21 and the arcuate surface 22 of the inner surface 14. The notch 16 may be positioned directly at the transition between the straight flat face 21 and the arcuate surface 22 or in the flat face 21 at a position that is closer to the arcuate surface 22 than the lateral centre of the flat face 21, for example towards one end of the flat face 21.

The notch 16 may have a smooth profile without sharp edges and extend from the upper surface 17 of the base 12 of the pocket 11 to the upper surface 18 of the circular perimeter 13. As can be better seen in the enlarged view of FIG. 2b, the notch 16 includes a base 23, which includes a first radius r1. The base 23 extends into a first lip 24 which extends into the arcuate surface 22 of the substantially circular perimeter 13 and extends into a second lip 25 which extends into the flat face 21. The first lip 24 includes a radius r2 and the second lip 25 includes a radius r3. The centre points of the radius r2 and r3 may lie radially outward of the inner face 14, whereas the centre point of the radius r1 of the base 23 of the notch 16 may lie radially inwardly of the inner face 14 so that the notch has a S-shaped profile in the top view.

The wafer carrier 20 and, consequently, the wafer accommodated within the wafer carrier 20, may be rotated during processing of the wafer either anticlockwise or clockwise around an axis 26 extending perpendicularly to the upper surface 17 of the base 12 of the pocket 11. The notch 16 may be positioned at the trailing side of the flat face 21 with respect to the direction of rotation as illustrated in FIG. 2a by arrow 27. The direction of rotation may depend on the setup of the apparatus in which the wafer carrier is used so that the position of the notch 16 may be selected accordingly.

The flat face 21 provides an orientation marker for determining the orientation of the wafer including a flat face accommodated within the pocket 11 of the wafer carrier 20. The contour or shape of the inner face 14 of the pocket 11 conforms to the outer contour of the wafer to be accommodated within the pocket 11. This arrangement prevents rotation of the wafer relative to the pocket 11 and to the wafer carrier 20. By avoiding relative rotation of the wafer within the pocket during growth of a layer or layers on the wafer, localised stress points at the outer contour of the wafer are avoided.

Additionally, since the contour or shape of the inner face 14 of the pocket 11 conforms to the outer contour of the wafer, the pocket 11 of the wafer carrier is covered by the wafer during deposition of a layer on the wafer, so that deposition of material onto the interior of the pocket 11 is hindered or even prevented. Deposition of material into the interior of the pocket 11 may provide a localised stress point if the wafer comes into contact with this deposited material and lead to the formation of slip lines or other crystallographic defects within the deposited layer. As a result of the contour or shape of the inner face 14 of the pocket 11 conforming to the outer contour of the wafer, the temperature of the wafer during deposition may be more uniform. This may also assist in reducing or even avoiding the formation of slip lines and other defects in the deposited layer or layers.

In some embodiments, a further notch is provided which is arranged at the opposite end of the flat face 21 and which may be arranged at the opposing interface or junction between the flat face 21 and the arcuate surface 22 of the inner face 14.

Figure 2C:
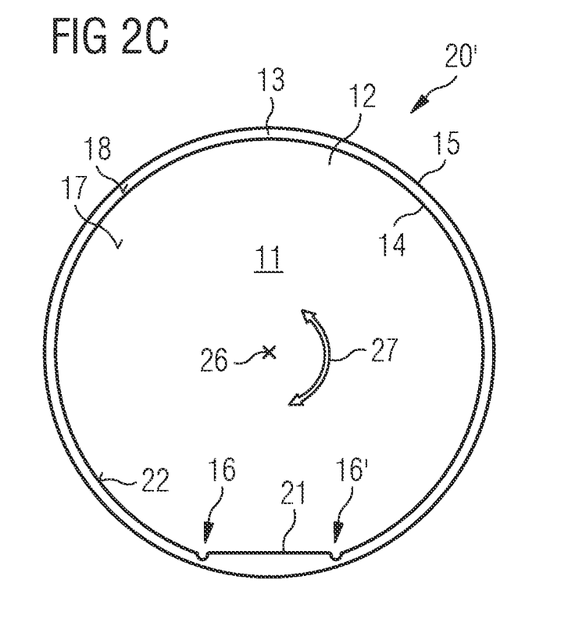
FIG. 2c illustrates a top view of a wafer carrier including an orientation marker according to a further embodiment.

FIG. 2c illustrates a wafer carrier 20' that is suitable for use in apparatus in which the wafer carrier is rotated in both the clockwise and anticlockwise directions. In these embodiments, a notch 16, 16' may be provided at the two opposing ends of the flat face 21 such that a notch 16, 16' is present at the trailing edge for both directions of rotation about the axis 26.

The orientation marker may be integral with the wafer carrier 20 and formed by the shape of the inner face 14 of the substantially circular perimeter 13 as in the embodiment illustrated in FIGS. 2a-2c.

In some embodiments, a wafer carrier is provided which has a removable orientation marker. This may allow the wafer carrier to be used with orientation markers having differing forms thus allowing the wafer carrier to be used with wafers having differing forms of orientation marker. The removable orientation marker may include one or more notches. In some embodiments, the removable orientation marker may have a flat face having a length selected to correspond to a length of a flat face of an outer side face of a wafer. Removable orientation markers having a flat face of differing length may be used with the same wafer carrier so as to allow the wafer carrier to be used for wafers having a flat face of different lengths, for example. Removable orientation markers also assist with ease of removal of the wafer and further enhance the lifetime of the wafer carrier.

FIGS. 3a-3d and 4a-4d illustrate views of a wafer carrier 30 and a removable orientation marker 31 according to an embodiment. The orientation marker 31 may include one or more notches.

Figure 3A:
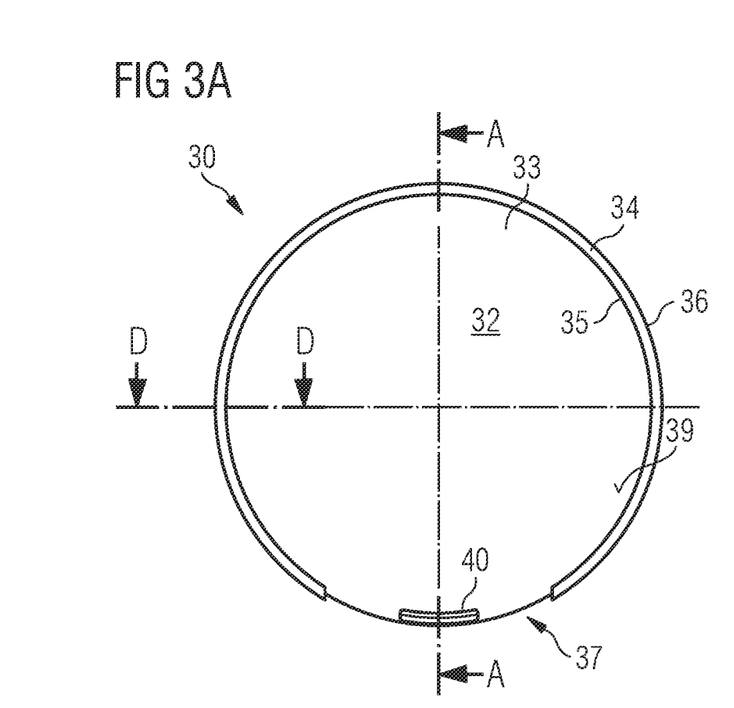
FIG. 3a illustrates a top view of a wafer carrier including a removable orientation marker.

FIG. 3a illustrates a top view of the wafer carrier 30. The wafer carrier 30 includes a pocket 32 that is sized and shaped to accommodate a wafer and includes a base 33 and substantially circular perimeter 34 including an inner face 35 and an outer face 36. The inner face 35 and the outer face 36 define a wall or lip building the peripheral edge of the pocket 32 which has a substantially circular base 33 bounded by the inner face 35. The wafer carrier 30 includes a portion for engaging with the removable orientation marker 31 which may be provided by a depression, for example. In some embodiments, an arcuate section 37 of the circular perimeter 34 of the wafer carrier 30 is provided for accepting the orientation marker 31.

Figure 3B:
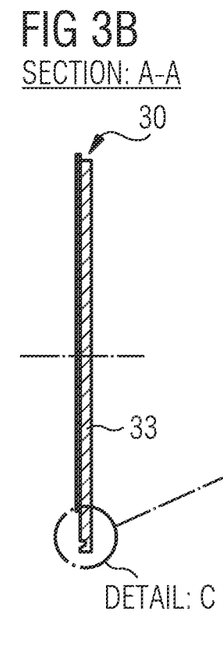
Figure 3C:
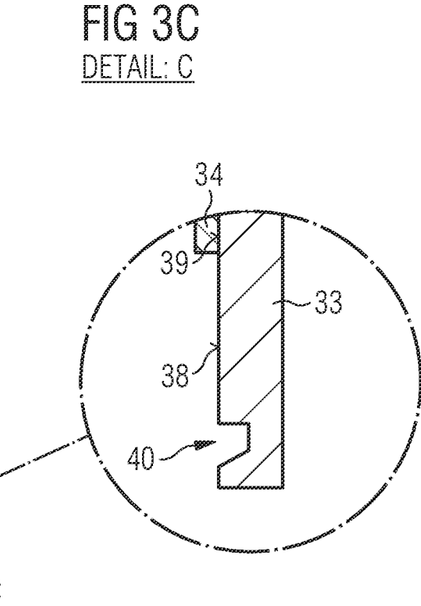
FIG. 3c illustrates detailed view C of FIG. 3b.
Figure 3D:
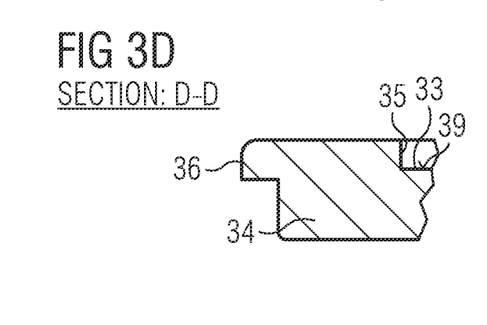

FIG. 3b illustrates a cross-sectional view along the line A-A of the pocket 32 and FIG. 3c illustrates a detail of an arcuate section 37. FIG. 3d illustrates a cross-sectional view along the line D-D of further portion of the substantially circular perimeter 34 illustrating the inner face 35 of the circular perimeter 34 bounding the pocket 32.

The arcuate section 37 is formed by a depression or the removal of a portion of the circular perimeter 34 so that the arcuate section 37 includes an upper surface 38 which is substantially coplanar with an upper surface 39 of the base 33 of the pocket 32 for accommodating the removable orientation marker 31. The upper surface 38 also includes engaging means in the form of a depression 40 for mechanically engaging with the removable orientation marker 31 so as to secure the removable orientation marker 31 and the pocket 32.

Figure 4A:
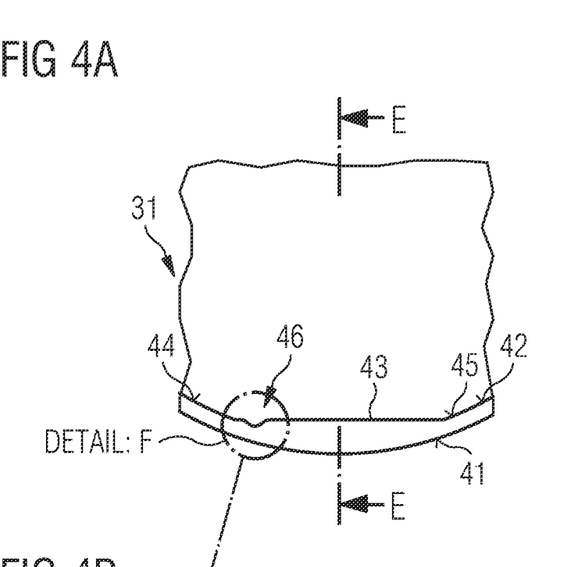
FIG. 4a illustrates a top view of the orientation marker for use with the wafer carrier of FIG. 3.

FIG. 4a illustrates a top view of the orientation marker 31 which is sized and shaped to be accommodated within the arcuate section 37 and to engage with the wafer carrier 30. The orientation marker 31 includes an outer surface 41 and an inner surface 42. The outer surface 41 has an arcuate form that is sized and shaped to align with the substantially circular perimeter 34 of the pocket 32 to provide a substantially circular outer face. The inner surface 42 includes a flat face 43, which extends at opposing ends into an arcuate surface 44, 45. The inner surface 42 of the orientation marker also includes a notch 46 which arranged at the interface of transition between the flat face 43 and the arcuate surface 44.

The arcuate surfaces 44, 45 are sized and shaped to align with the inner face 35 of the circular perimeter 34 of the pocket 32 when the orientation maker is assembled on the wafer carrier 30. The flat face 43 forms a chord with the arcuate surfaces 44, 45 and is sized and shaped to accommodate a wafer with a flat within the pocket 32 when the orientation marker 31 is assembled on the pocket 32 to form the wafer carrier 30.

Figure 4B:
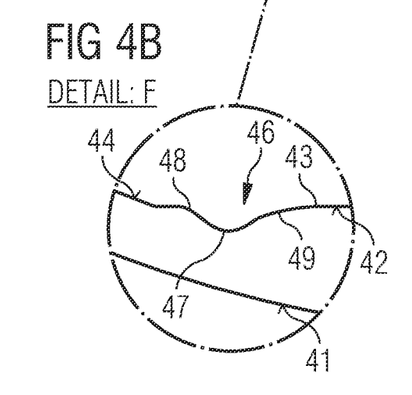

FIG. 4b illustrates a detailed view of the notch 46 arranged in the interface between the flat face 43 and arcuate surface 44 of the removable orientation marker 31. The notch 46 includes a base 47 including a radius $r_1$ which merges into a first lip 48 extending towards the arcuate surface 44 and a second lip 49 extending towards the flat face 43. The first lip 48 and the second lip 49 each have a radius $r_2$, $r_3$ which may be of the same value or differing value.

Figure 4C:
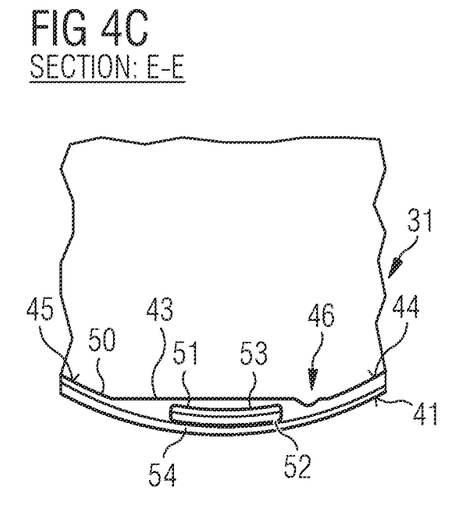
Figure 4D:
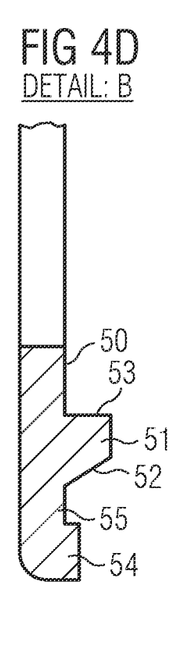

FIG. 4c illustrates a view of the lower side 50 of the removable orientation marker 31 and FIG. 4d includes a cross-sectional view of the orientation marker 31. As illustrated in FIG. 4c, the lower side 50 includes a protrusion 51 that is sized and shaped to engage with the depression 40 in the upper surface 38 of the pocket 32.

In this particular embodiment, the protrusion 51 includes an outer engagement face 52 that extends at an inclined angle from the lower surface 53 towards the inner surface 42 and an inner engagement face 53 which extends essentially perpendicularly from the lower surface 53. The orientation marker 31 also includes an outer leg 54 extending from the lower surface 53 such that the orientation marker 31 may be mechanically engaged to the pocket 32 by both protrusion 51 and by a depression 55 formed between the inner face of the leg 54 and the outer engagement face 53.

FIGS. 5a-5d illustrate enlarged views of two examples of notches 60, 60' which may be used in the wafer carrier of any one of the embodiments. The notch 60, 60' may be arranged in an inner face of a lip or peripheral wall defining a pocket for a wafer, an inner face of an orientation marker that is integral with a lip or peripheral wall defining a pocket for a wafer or in an inner face of a removable orientation marker.

Figure 5A:
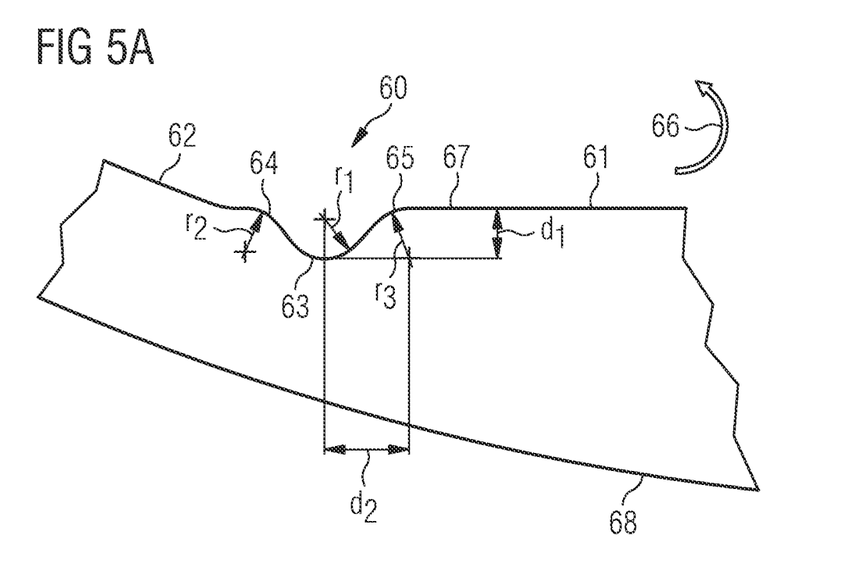
FIG. 5a illustrates a plan view of a portion of wafer carrier including a notch according to an embodiment.
Figure 5B:
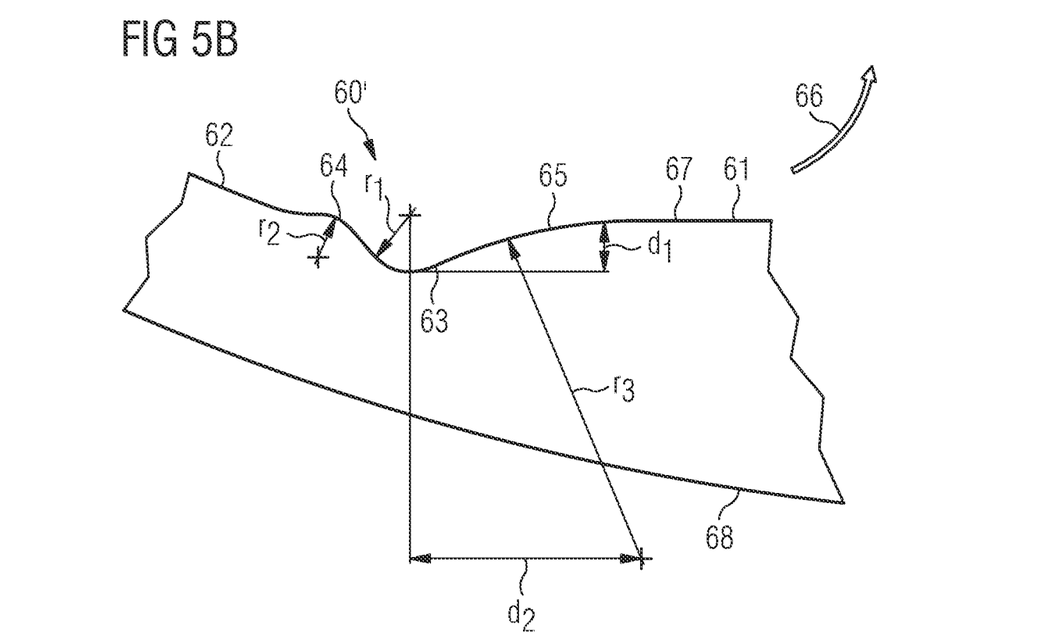
FIG. 5b illustrates a portion of a wafer carrier including a notch according to a further embodiment.

The notch 60, 60' is arranged at the transition between a flat face 61 and an arcuate face 62 of the inner face 67. The outer face 68 is substantially circular and together with the inner face 67 forms a continuous uninterrupted wall. The notch 60, 60' includes a base 63 extending into a first lip 64 which extends into the arcuate surface 62 and a second lip 65 which extends from the base 63 into the flat face 61. The base 63 includes arcuate surface having a radius $r_1$, the first lip 64 includes an arcuate surface defined by radius $r_2$ and the second lip 65 includes arcuate surface having a radius $r_3$.

The centre point of the radius $r_1$ is positioned radially inwardly, that is towards the centre of the base of the substantially circular perimeter of the wafer carrier, and the centre point of the radius $r_2$ of the first lip 64 and the centre point of the radius $r_3$ of the second lip 65 are positioned radially outwardly of the centre point of the radius $r_1$ so that the notch 60, 60' has a S-shaped contour.

The second lip 65 provides the leading edge of the notch 60, 60' and the first lip 64 the trailing edge of the notch 60, 60', since the notch 60, 60' is provided for use in a wafer carrier which is to be rotated in an anticlockwise direction about an axis extending perpendicular to the plane of the drawing, as indicated by the arrow 66.

In the embodiment illustrated in FIG. 5a, the radius $r_1$ of the base 63, the radius $r_2$ of the first lip 64 and the radius $r_3$ of the second lip 65 of the notch 60 are substantially the same. For example, the radius $r_1$ may be around one hundredth of the diameter of the wafer to be accommodated in the pocket. For a 150 mm wafer, the radii $r_1$, $r_2$ and $r_3$ may each be around 1.5 mm to 1.6 mm, for example. In the embodiment illustrated in FIG. 5a, the depth $d_1$ of the notch 60 is approximately the same distance as the radius $r_1$. The distance $d_2$ between the base of the notch 60 and the flat face 61 may be around $r_1$ and around 1.5 mm, for example.

In the embodiment illustrated in FIG. 5*b*, the radius $r_3$ of the second lip 65 of the notch 60' is greater than the radius $r_1$ of the base 63 and the radius $r_2$ of the first lip 64. For example, $r_3$ may be up to ten times $r_1$ so that $r_1 < r_3 \leq 10 r_1$. In the embodiment illustrated in FIG. 5*b*, the distance $d_2$ between the centre of the base 63 and the flat face 61 is larger than in the embodiment illustrated in FIG. 5*a* and may be around 12.5 mm, for example.

The flat face 61 forms a chord with the arcuate face 62 of the inner face 67 of the pocket of a wafer carrier and has a length and position such that the inner contour of the pocket corresponds to the outer contour of the wafer. This arrangement may be used to assist in achieving a uniform temperature of the wafer during deposition, preventing rotation of the wafer with respect to the wafer carrier within the pocket and/or deposition of material into areas of the pocket uncovered by the wafer so as to increase the quality of the layer or layers deposited on the wafer. For a layer of layers deposited epitaxially onto the wafer, the improved quality may be seen as a reduction or even absence in the number of slip lines or other crystallographic defects in the epitaxially deposited layer(s).

The notch 60' has an asymmetric form and is configured for a wafer carrier which is to be rotated anticlockwise. For a wafer carrier which is to be rotated in the opposing clockwise direction, the shape of the notch is reversed so that the first lip 64 has a larger radius than the second lip 65 since the first lip 64 now provides the leading edge. The notch 60, 60' may be positioned at the trailing edge of the flat face 61 with respect to the direction of rotation.

Figure 5C:
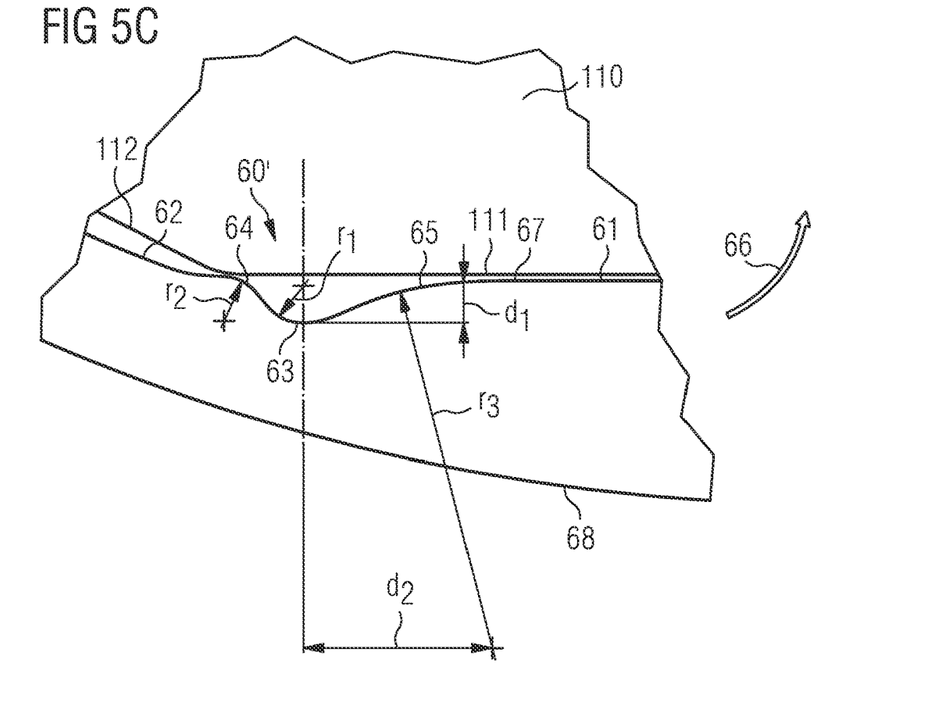
FIG. 5c illustrates a plan view of a portion of a wafer in the wafer carrier of FIG. 5b in a first position.

FIG. 5*c* illustrates a plan view of a portion of a wafer 110 within the pocket in a first position. The wafer 110 has the form of a substantially circular disc with an outer contour formed by a flat face 111 and an arcuate face 112. The outer contour of the wafer 110 substantially corresponds to the inner contour of the pocket provided by the arcuate face 62 of the inner face 67 of the perimeter wall of the pocket and the flat face 61. In this first position, the distance between the outer contour of the wafer 110 and the flat face 61 and arcuate face 62 of the wafer carrier is substantially uniform and may be the same. This first position illustrated in FIG. 5*c* may correspond to a situation in which the wafer 110 has been placed into the pocket of the wafer carrier before processing has begun.

Figure 5D:
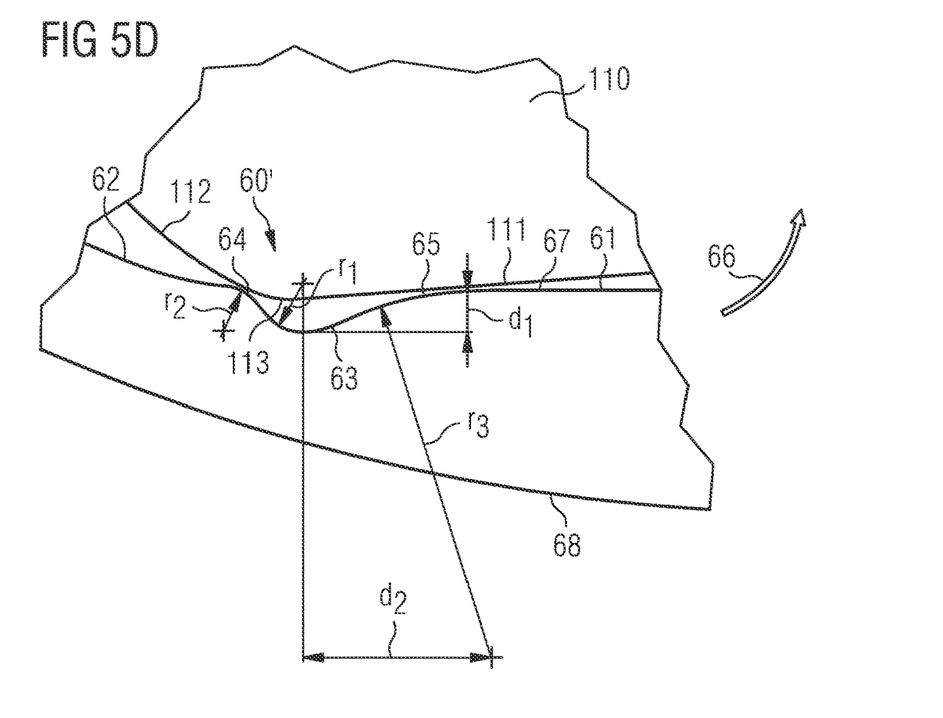
FIG. 5d illustrates a plan view of a portion of a wafer in the wafer carrier of FIG. 5b in a second position.

FIG. 5*d* illustrates a plan view of a portion of a wafer 110 within the pocket in a second position. In this second position, the distance between the outer contour of the wafer 110 and the flat face 61 and arcuate face 62 of the wafer carrier is non-uniform. For example, the interface 113 between the flat face 111 and arcuate face 112 of the wafer may be positioned within the notch 60,60' and the flat face 111 of the wafer 110 may be in contact with the second lip 65 of the notch 60,60'. The flat face 111 of the wafer 110 is no longer positioned parallel to the flat face 61 of the wafer carrier, but at an inclined angle.

The second position illustrated in FIG. 5*d* may correspond to a situation in which the wafer 110 has been processed while positioned in the pocket of the wafer carrier and while the pocket and/or wafer carrier has been rotated anticlockwise. The wafer 110 may have rotated with respect to the pocket by a very small amount, but further rotation has been hindered by the inner contour of the pocket corresponding to the outer contour of the wafer 110. The notch 60,60' and its position at the interface 113 between the flat face 111 and arcuate face 112 of the wafer 110 may be used to assist in the removal of the wafer 110 from the pocket despite the slight change in orientation during processing.

The wafer carrier according to any one of the embodiments may be used for the high temperature high quality epitaxial growth of semiconductor structures such as GaN-based HEMT (High Electron Mobility Transistor) structures. These multi-layer structures may include multiple Group III nitride-based layers of differing composition and the structure may have a thickness of at least 3 µm. These multi-layer epitaxial structures may be grown on large area Si substrates, for example a 6 inch diameter single crystal silicon wafer. The use of the wafer carrier including one or more notches at the interface between the side face of the wafer and inner face of the pocket enables a high yield while reaping the benefits of wafers conforming to the shape of the wafer carriers. Breakage of wafers during growth and post-growth during further processing can be avoided and robust/reliable devices produced.

Figure 6:
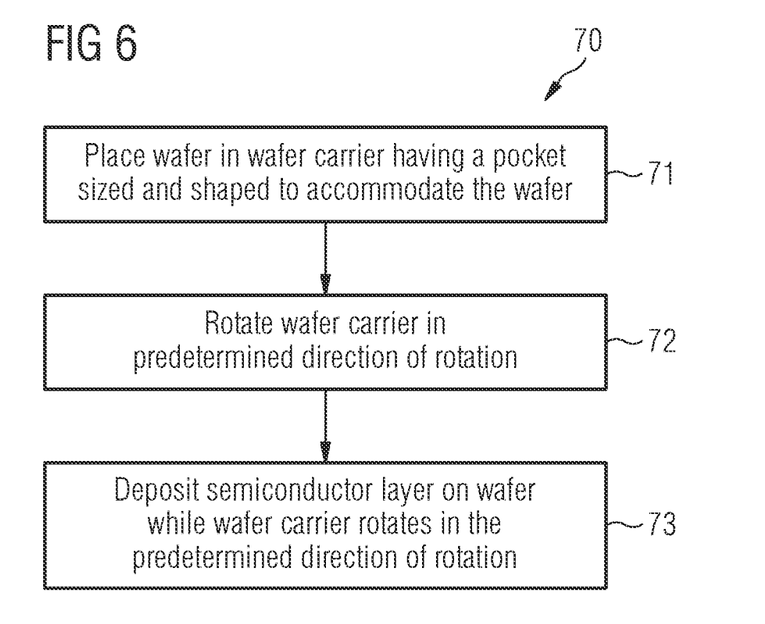
FIG. 6 illustrates a flow chart for fabricating one or more epitaxial layers on a wafer using a wafer carrier with a notch.

FIG. 6 illustrates a flowchart 70 of a method which may be used to fabricate a semiconductor device. In box 71, a wafer is placed in a wafer carrier including a pocket that is sized and shaped to accommodate a wafer, the pocket being defined by a base and a substantially circular peripheral wall comprising an inner face and an outer face, wherein a notch in the inner face of the substantially circular peripheral wall provides a localised increased gap between the inner face and a side face of the wafer, the wafer carrier having a predetermined direction of rotation about an axis positioned perpendicular to an upper surface of the base of the pocket. In box 72, the wafer carrier is rotated in the predetermined direction of rotation. In box 73, a semiconductor layer is epitaxially deposited on the wafer while rotating the wafer carrier in the predetermined direction of rotation.

The wafer carrier of the embodiments described herein may be used in the method illustrated by the flow chart 70. The substantially circular peripheral wall may extend continuously around the base and have a uniform thickness. The substantially circular peripheral wall may include an integral orientation marker and may have an increased thickness in one section providing a flat face that is sized and shaped to conform to a flat on a wafer. The substantially circular peripheral wall may also include an orientation marker that is removable and the notch may be arranged in the removable orientation marker. The removable orientation marker may include a flat face that is sized and shaped to conform to a flat on a wafer.

The semiconductor layer, which is epitaxially deposited onto the wafer, may include a Group III nitride, for example. Typically, two or more Group III nitride-based layers are epitaxially deposited in a stack to produce a structure for a semiconductor device such as a High Electron Mobility Transistor (HEMT) or a Light Emitting Diode (LED), for example. The wafer may be a single crystal wafer having a surface which is capable of supporting the epitaxial growth of a Group III nitride layer. The wafer may include <100> silicon, <111> silicon, sapphire or silicon carbide, for example.

The semiconductor layer may be epitaxially deposited using vacuum deposition techniques such as MOCVD (Metal Organic Chemical Vapour Deposition) which are carried out at elevated temperatures, for example at a temperature of 600° C. or above.

Figure 7:
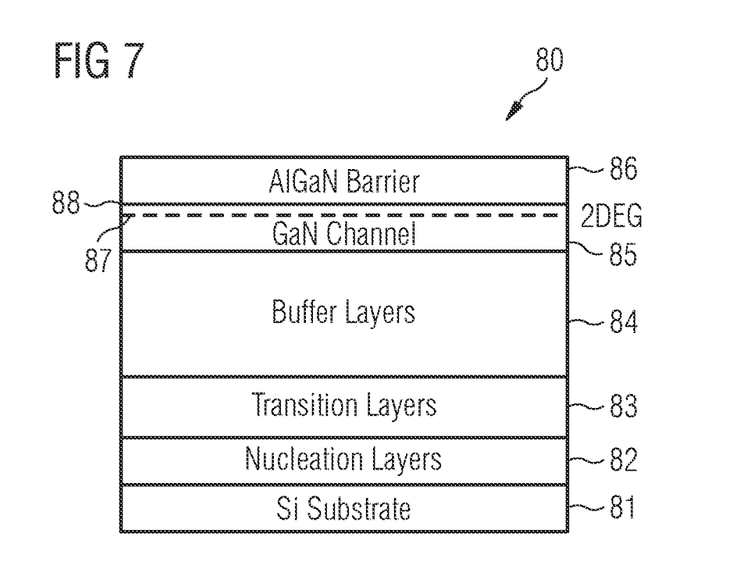
FIG. 7 illustrates a semiconductor structure which may be fabricated using a wafer carrier including a notch.

FIG. 7 illustrates an example of a structure which may be fabricated on a wafer using the wafer carrier according to one of the embodiments described herein. The semiconductor structure 80 is epitaxially built up or grown on a substrate 81 provided by a substrate having a surface capable of supporting the epitaxial growth of the desired semiconductor material, i.e. Group III nitrides. The substrate may include a <111> silicon wafer, for example. One or more nucleation layers 82 may be deposited on the wafer 81. One or more transition layers 83 may be epitaxially deposited on the nucleation layer 82, one or more buffer layers 84 may be epitaxially deposited on the transition layer 83, a Group III nitride channel layer 85, for example, Gallium Nitride, may be deposited on the uppermost buffer layer 84 and a Group III nitride barrier layer 86 may be deposited on the Group III nitride channel layer 85. The Group III nitride barrier layer 86 may include $Al_{1-x}Ga_xN$, where $0<x<1$.

The Group III nitride-based barrier layer 86 typically includes a different composition and different bandgap compared to the underlying Group III nitride channel layer 85 such that a two-dimensional charge gas 87, such as a two-dimensional electron gas (2DEG) is formed at the interface 88 between the Group III nitride-based barrier layer 86 and the Group III nitride-based channel layer 85 by induced and spontaneous polarization.

A transistor device such as a HEMT may be formed using the structure, as illustrated in FIG. 7, by depositing conductive source, gate and drain electrodes on the Group III nitride barrier layer 86.

Figure 8A:
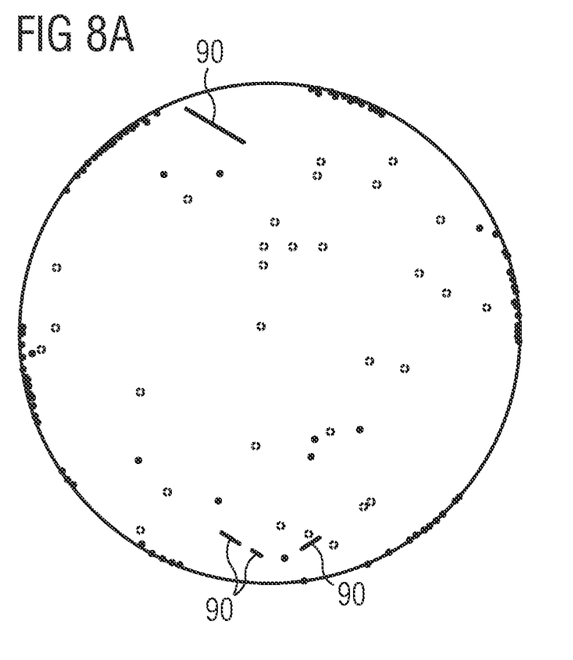
FIG. 8a illustrates test results obtained for a wafer fabricated using a wafer carrier without a notch.
Figure 8B:
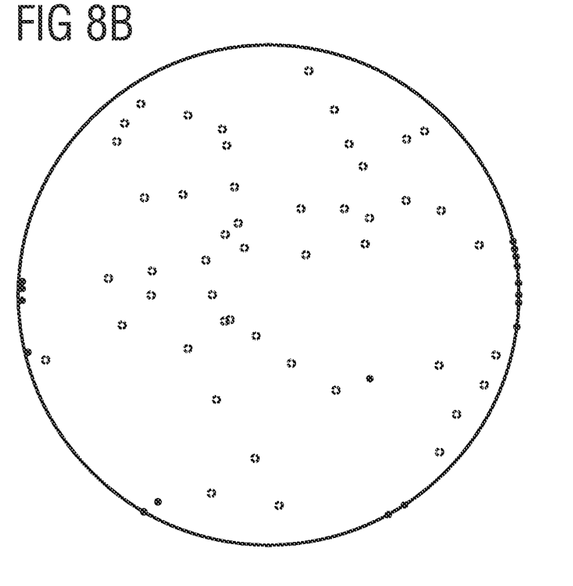
FIG. 8b illustrates test results obtained for a wafer fabricated using a wafer carrier with a notch.

FIG. 8a and FIG. 8b illustrate maps of defects detected in two wafers. Each wafer includes a Group nitride-based structure illustrated in FIG. 7 grown on a 6 inch silicon <111> wafer. The total height of Group III nitride-based structure is around 5.5 μm. FIG. 8a illustrates the results for a comparison wafer fabricated using a circular pocket wafer carrier without a notch and FIG. 8b illustrates the results for a wafer fabricated using wafer carrier having a flat face and a notch.

The comparison example of FIG. 8a includes slip lines in the Group III nitride-based structure as indicated by the lines 90. Slip lines are not detected in the wafer fabricated using the wafer carrier including a flat face with a notch, as illustrated in FIG. 8b.

The wafer carrier including the flat face with a notch has an inner contour corresponding to the outer contour of the wafer. Consequently, the pocket of the wafer carrier is covered by the wafer during deposition of Group III nitride-based structure, so that deposition of Group III nitride material onto the interior of the pocket is hindered or even prevented. Additionally, rotation of the wafer within the pocket with respect to the wafer carrier is hindered due to the corresponding inner contour or the wafer carrier. As a result, localised stress points at the outer contour of the wafer are avoided and the temperature of the wafer during deposition is more uniform so that the formation of slip lines and other defects can be avoided. The presence of the notch in the flat face of the wafer carrier may be used to avoid wedging of the wafer within the wafer carrier and to assist in the removal of the wafer from the wafer carrier without breakage of the wafer.

As discussed above, the flat face of the wafer carrier acts as an orientation marker and corresponds to a flat face positioned on the wafer which is to be accommodated within the pocket of the wafer carrier. In some embodiments, the wafer may include an orientation marker in the form of a notch in place of the flat.

Figure 9:
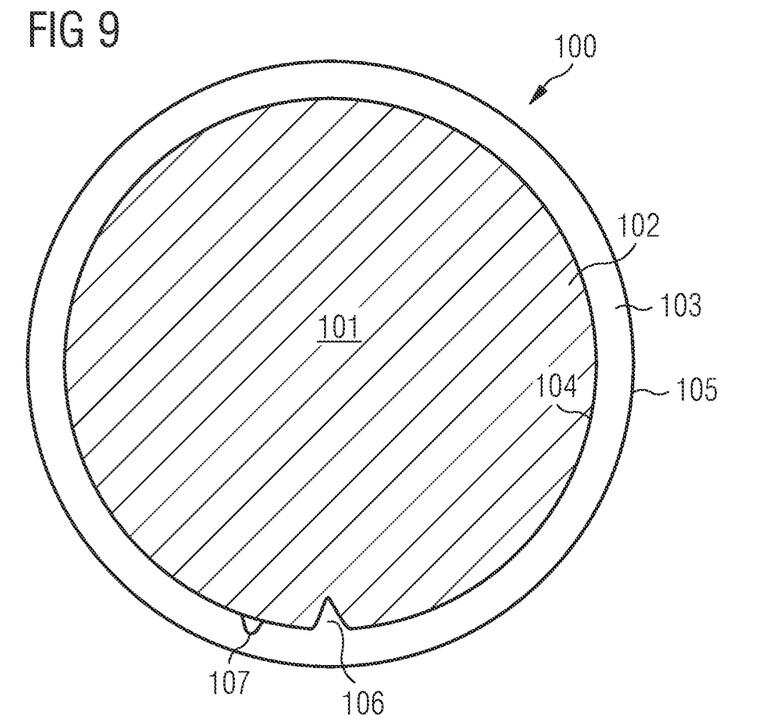
FIG. 9 illustrates a wafer carrier including an orientation marker in the form of a protrusion.

FIG. 9 illustrates a wafer carrier 100 according to an embodiment which is adapted to be used for wafers including a notch. The wafer carrier 100 includes a pocket 101 defined by the base 102 and a substantially circular perimeter 103 having an inner face 104 and an outer face 105. The wafer carrier 100 further includes a protrusion 106 which is sized and shaped to engage with the notch on the semiconductor wafer. The wafer carrier 100 also includes a notch 107 in the interface 104 according to one of the embodiments described herein.

If the wafer carrier used for epitaxial growth of foreign materials on a substrate, such Group III nitrides on a Silicon (Si) wafer, has a round recessed pocket and the wafer has a flat, the shape of the pocket does not conform to the shape of a wafer having a flat. Consequently, the wafers are free to rotate within the wafer pocket. This may occur in use since most reactors (deposition apparatus) have a rotating disk construction to achieve suitable growth dynamics. Furthermore, not only the rotation of the wafer carrier may cause the wafer to rotate relative to the pocket, but also in the case of a static wafer carrier the flow of gases within a reactor under vacuum can cause the wafer to move within the pocket. This movement relative to the pocket may result in non-uniform temperature distributions across the wafer during growth which in turn may cause growth uniformity issues and defects like slip lines and cracks in the epitaxially grown layers.

If the contour of the wafer differs from the inner contour of the pocket, for example, the inner face of the pocket is circular whereas the wafer has a flat, material can be deposited within the pocket between the wafer flat and the perimeter producing growth nodules which may provide localized stress points. If the wafer spins relative to the pocket during growth, the wafer is exposed to areas with this growth, which may result in localized thermal gradients that may provide initiation points for slip lines.

Defect formation, such as the formation of slip lines and cracks in the epitaxially grown layer(s), may be an issue for the growth, using Organometallic Vapour Phase Epitaxy, of materials such as Aluminum Nitride (AlN) and Gallium Nitride (GaN) that require temperatures of greater than 1000° C. and have a high thermal mismatch with the material of the wafer, for example greater than 50% with Si. For example, the undesirable formation of cracks and slip lines during epitaxial growth of foreign materials like GaN on large area Si substrates with 100 mm, 150 mm, 200 mm, and larger diameter may occur.

By adapting the form or profile of the wafer carrier to conform to the shape of the substrate, issues associated with movement of the wafer and temperature non-uniformities, such as mechanical collisions of the wafer against the sidewall or inner face of the wafer carrier pocket, can be avoided due to tighter tolerances and restriction of the wafer from spinning within the pocket. Furthermore, a more uniform thermal gradient around the periphery of the wafer including the wafer flat may be achieved as the lip height of the periphery of the wafer carrier is the same, as opposed to the round pocket where the lip is not in contact with the wafer flat. Localized stress points or growth nodules can also be avoided as areas of the pocket are not exposed to epitaxial growth compared to a round pocket.

However, wafer carriers that conform to the shape of the wafer can result in wafer breakage during epitaxial growth. This breakage may be caused by the movement of the wafer within the pocket resulting in wedging of the wafer against the wafer carrier flat.

A notch formed in the inner face of the wafer carrier, for example at the interface or junction between the flat face and arcuate surface of the inner face of the pocket, provides a relief point or localised region at the wafer carrier flat and enable easy extraction of the wafers and prevent wedging and breakage of wafers. At the same time, the use of an orientation marker so that the inner contour of the pocket conforms to the outer contour of the wafer provides better temperature uniformity during growth and avoids localised stress points. Yield and productivity can be improved by preventing breakage of wafers during epitaxial growth but also suppressed crack and slip line formation is achieved due to the wafer carrier conforming to the shape of the wafers.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A wafer carrier, comprising:
a pocket sized and shaped to accommodate a wafer, the pocket being defined by a base and a substantially circular perimeter comprising an inner face and an outer face, wherein the substantially circular perimeter comprises a notch in the inner face,
wherein the notch comprises a base having a first radius r1, a first lip transitioning between the substantially circular perimeter and the base of the notch and having a second radius r2, and a second lip transitioning between the substantially circular perimeter and the base of the notch and having a third radius r3,
wherein a center point of the first radius r1 lies radially inwardly of the inner face and center points of the second and third radii r2 and r3 lies radially outwardly of the inner face such that the notch has an s-shaped contour.

2. The wafer carrier of claim 1, wherein the substantially circular perimeter further comprises a flat face forming a chord with the inner face.

3. The wafer carrier of claim 2, wherein the notch is arranged at a first interface between the flat face and the substantially circular perimeter.

4. The wafer carrier of claim 3, further comprising a further notch arranged at a second interface between the flat face and the substantially circular perimeter, the second interface opposing the first interface.

5. The wafer carrier of claim 1, wherein the substantially circular perimeter comprises a protrusion in the inner face, the protrusion being sized, shaped and arranged to engage with an orientation notch of the wafer to be accommodated by the pocket.

6. The wafer carrier of claim 1, wherein the notch is asymmetric.

7. The wafer carrier of claim 1, wherein the third radius r3 is greater than the first radius r1 and the second radius r2.

* * * * *